United States Patent
Yoshizawa

(10) Patent No.: US 7,360,273 B2
(45) Date of Patent: Apr. 22, 2008

(54) SUBSTRATE CLEANING DEVICE AND SUBSTRATE PROCESSING FACILITY

(75) Inventor: Takenori Yoshizawa, Tsu (JP)

(73) Assignee: Sharp Kabushiki Kaisha, Osaki-shi, Osaka (JP)

( * ) Notice: Subject to any disclaimer, the term of this patent is extended or adjusted under 35 U.S.C. 154(b) by 784 days.

(21) Appl. No.: 10/717,620

(22) Filed: Nov. 21, 2003

(65) Prior Publication Data
US 2004/0139574 A1 Jul. 22, 2004

(30) Foreign Application Priority Data
Jan. 21, 2003 (JP) .............................. 2003-012877

(51) Int. Cl.
*A47L 5/14* (2006.01)
(52) U.S. Cl. .................... 15/303; 15/306.1; 15/345; 15/405; 134/902
(58) Field of Classification Search .................. None
See application file for complete search history.

(56) References Cited

U.S. PATENT DOCUMENTS

| | | |
|---|---|---|
| 5,226,437 A | 7/1993 | Kamikawa et al. |
| 5,265,632 A | 11/1993 | Nishi |
| 5,311,893 A | 5/1994 | Nishi |
| 7,047,984 B2 * | 5/2006 | Blattner et al. .............. 134/1.3 |

FOREIGN PATENT DOCUMENTS

| | | |
|---|---|---|
| JP | 6-163505 A | 6/1994 |
| JP | 6-165960 A | 6/1994 |
| JP | 9-15547 A | 1/1997 |
| JP | 2003-007662 A | 1/2003 |
| KR | 1992-0022411 A | 12/1992 |
| KR | 2002-0087637 A | 11/2002 |

* cited by examiner

*Primary Examiner*—David A Redding
(74) *Attorney, Agent, or Firm*—Birch, Stewart, Kolasch & Birch, LLP

(57) ABSTRACT

A substrate cleaning device is provided, which comprises a first cleaning room including a first cleaning portion for cleaning a substrate placed therein, and a second cleaning room including a second cleaning portion for cleaning a substrate provided therein. The first cleaning room is stacked on the second cleaning room so that at least a portion of the first cleaning room overlaps at least a portion of the second cleaning room.

6 Claims, 6 Drawing Sheets

SUBSTRATE CLEANING DEVICE AND SUBSTRATE PROCESSING FACILITY

This Nonprovisional application claims priority under 35 U.S.C. §119 (a) on Patent Application No(s). 2003-012877 filed in JAPAN on Jan. 21, 2003, the entire contents of which are hereby incorporated by reference.

BACKGROUND OF THE INVENTION

1. Field of the Invention

The present invention relates to a substrate cleaning device and a substrate processing facility. More particularly, the present invention relates to a substrate cleaning device for cleaning a surface of a substrate (e.g., a glass substrate, etc.) for use in a display panel (e.g., a liquid crystal display panel of a liquid crystal display device, etc.), and a substrate processing facility comprising the substrate cleaning device.

2. Description of the Related Art

A typical liquid crystal display panel of a liquid crystal display device comprises a pair of transparent substrates (e.g., glass substrates, etc.). Thin film transistors (TFTs) are provided on a surface of one of the glass substrates, while a color filter is provided on a surface of the other glass substrate. The two glass substrates are attached to each other. Further, liquid crystal is sandwiched between the two glass substrates. In this manner, a liquid crystal display panel is produced.

In a manufacturing plant for liquid crystal display panels, glass substrates brought into the plant are supplied to various process steps after the surfaces thereof are cleaned. In the process steps, TFTs are formed on some of the glass substrates; a color filter is provided on some of the glass substrates; and the like. In each process step, the surface of the glass substrate is cleaned immediately before a certain process. Therefore, liquid crystal display panel manufacturing plants require a number of devices for cleaning the surfaces of glass substrates for use in liquid crystal display panels.

FIG. 9 is a front view showing an exemplary layout of an apparatus for processing glass substrates in a manufacturing plant of liquid crystal display devices. FIG. 10 is a plan view of the apparatus of FIG. 9.

A process apparatus 52 for carrying out predetermined processes on glass substrates is provided in a clean room 51. At an upper portion of the clean room 51, a plurality of hyper performance filters 53 are arranged in a horizontal direction. Each hyper performance filter 53 supplies clean air which flows down into the clean room 51.

In the clean room 51, the process apparatus 52 is provided with a loading apparatus 55 for transporting a glass substrate. The loading apparatus 55 transports a glass substrate in a linear direction along the process apparatus 52. A plurality of glass substrates to be used for liquid crystal display panels are brought into the clean room 51 where the glass substrates are housed in cassettes 40. The cassettes 40 are placed along a transporting direction (i.e., longitudinal direction) of the loading apparatus 55 and at a side of the loading apparatus 55. A cleaning device 56 for removing dust or the like from the glass substrate is provided adjacent to an end of the loading apparatus 55.

In each cassette 40, a plurality of glass substrates oriented horizontally are stacked vertically, spaced at appropriate intervals. The loading apparatus 55 is provided with a glass substrate suctioning hand having a pair of planar suctioning pads in parallel, which picks out a glass substrate from one of the cassettes 40 brought in along the side of the loading apparatus 55. The glass substrate suctioning hand can be moved vertically and longitudinally with respect to the loading apparatus 55.

A glass substrate which has been picked out by the glass substrate suctioning hand of the loading apparatus 55 is transported down to the cleaning device 56, in which the glass substrate is in turn placed. The surface of the glass substrate in the cleaning device 56 is cleaned by the cleaning device 56. The cleaned glass substrate is picked out from the cleaning device 56 by the glass substrate suctioning hand of the loading apparatus 55, and is transported to a predetermined position of the process apparatus 52.

An example of the glass substrate cleaning device 56 is disclosed in, for example, Japanese Laid-Open Publication No. 6-165960. In this device, a glass substrate to be cleaned is horizontally placed therewithin; pulsed waves of air are blown from a blowing nozzle to a surface (upper surface) of the glass substrate so that dust attached on the surface is removed; and the substrate is suctioned with a suctioning nozzle.

Recently, display panels comprise a glass substrate having a thickness of about 0.7 mm or less. As display panels are enlarged, the size of glass substrates brought into liquid crystal display panel manufacturing plants is increased up to a rectangular glass substrate having a side of about 1.3 m or more.

As described above, a number of cleaning devices 56 (FIGS. 9 and 10) are employed in liquid crystal display panel manufacturing plants. When glass substrates having a large area are handled, the cleaning device 56 needs to be enlarged so that the large-size glass substrate is horizontally placed therein. In this case, the cleaning device 56 disadvantageously occupies a large area. Since a liquid crystal display panel manufacturing plant requires a number of cleaning devices 56, the manufacturing plant requires a large area, possibly leading to a reduction in cost effectiveness.

SUMMARY OF THE INVENTION

According to an aspect of the present invention, a substrate cleaning device is provided, comprising: a first cleaning room including a first cleaning portion for cleaning a substrate placed therein; a second cleaning room including a second cleaning portion for cleaning a substrate provided therein. The first cleaning room is stacked on the second cleaning room so that at least a portion of the first cleaning room overlaps at least a portion of the second cleaning room.

In one embodiment of this invention, the substrate cleaning device further comprises a filter provided in an overlapping region of the first cleaning room and the second cleaning room.

In one embodiment of this invention, a first table is provided in the first cleaning room, and the first table is slid with the substrate placed in the first cleaning room being placed on the first table; and a second table is provided in the second cleaning room, and the second table is slid with the substrate placed in the second cleaning room being placed on the second table.

In one embodiment of this invention, the first cleaning room is open so that clean air flows into the first cleaning room.

In one embodiment of this invention, a first opening portion is provided on a side wall of the first cleaning room; and a second opening portion is provided on a side wall of the second cleaning room.

In one embodiment of this invention, the side wall of the first cleaning room provided with the first opening portion is opposite to the side wall of the second cleaning room provided with the second opening portion.

In one embodiment of this invention, the first cleaning portion comprises a first nozzle head having a first blowing portion for blowing gas onto the substrate placed in the first cleaning room and a first suctioning portion for suctioning the gas in the first cleaning room; and the second cleaning portion comprises a second nozzle head having a second blowing portion for blowing gas onto the substrate placed in the second cleaning room and a second suctioning portion for suctioning the gas in the second cleaning room.

In one embodiment of this invention, the first cleaning room and the second cleaning room are arranged so that when the first cleaning room and the second cleaning room are projected onto a plane perpendicular to a vertical direction, the area of an overlapping region of images thereof on the plane is maximized.

According to another aspect of the present invention, a substrate processing facility is provided, comprising a clean room. A substrate cleaning device is provided in the clean room. The substrate cleaning device comprises: a first cleaning room including a first cleaning portion for cleaning a substrate placed therein; and a second cleaning room including a second cleaning portion for cleaning a substrate provided therein. The first cleaning room is stacked on the second cleaning room so that at least a portion of the first cleaning room overlaps at least a portion of the second cleaning room.

In one embodiment of this invention, a first table is provided in the first cleaning room, and the first table is slid with the substrate placed in the first cleaning room being placed on the first table; and a second table is provided in the second cleaning room, and the second table is slid with the substrate placed in the second cleaning room being placed on the second table.

In one embodiment of this invention, a first loading apparatus for placing the substrate on the first table in the first cleaning room and a second loading apparatus for placing the substrate on the second table in the second cleaning room are provided in the clean room.

In one embodiment of this invention, the first loading apparatus and the second loading apparatus are arranged substantially on a line with the substrate cleaning device being sandwiched between the first loading apparatus and the second loading apparatus in the clean room.

Thus, the invention described herein makes possible the advantages of providing (1) a substrate cleaning device having a small footprint and capable of cleaning a substrate efficiently, and (2) a substrate processing facility which has a small footprint and uses the substrate cleaning device to efficiently process substrates.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
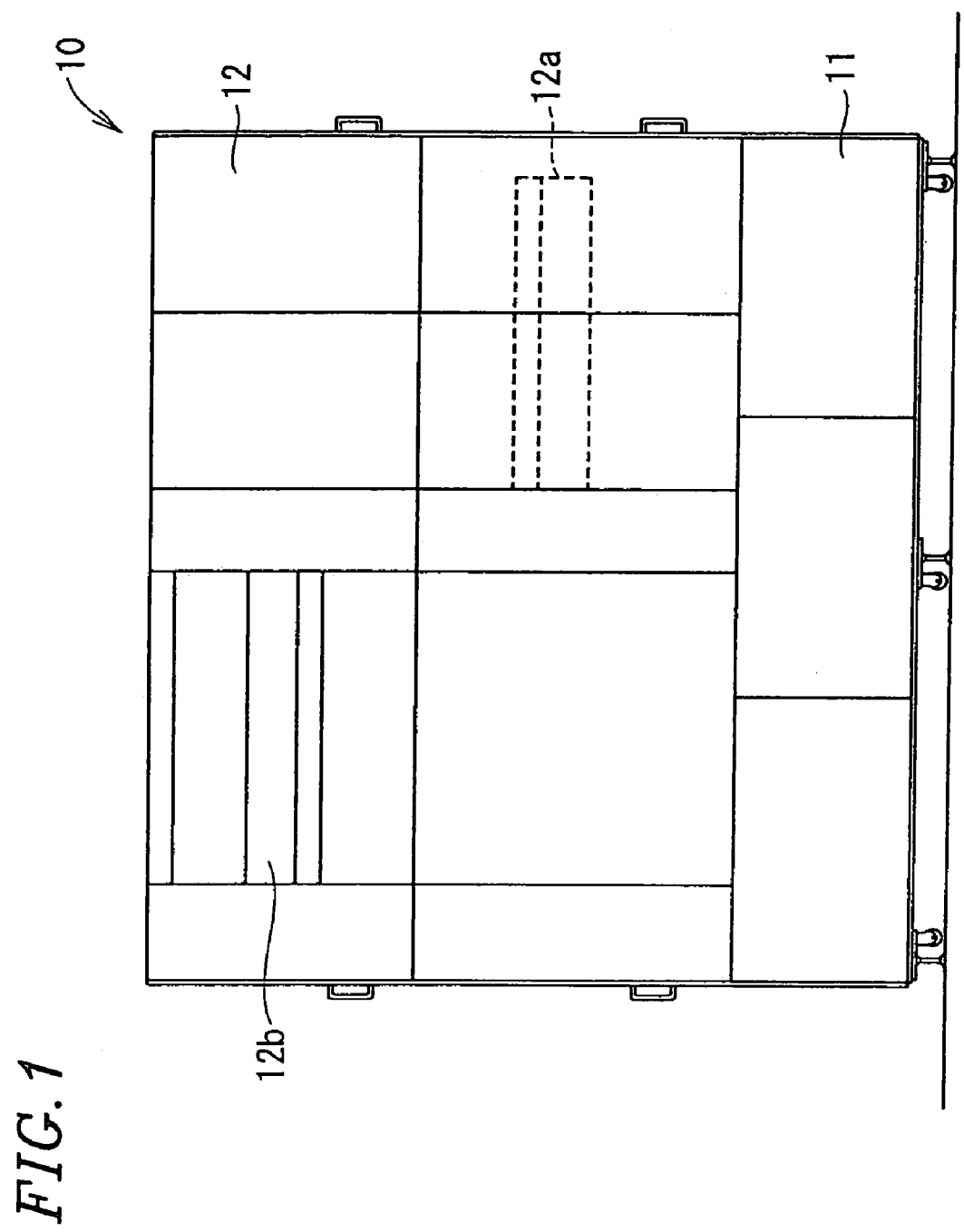
FIG. 1 is a front view showing an exemplary substrate cleaning device according to an embodiment of the present invention.
Figure 2:
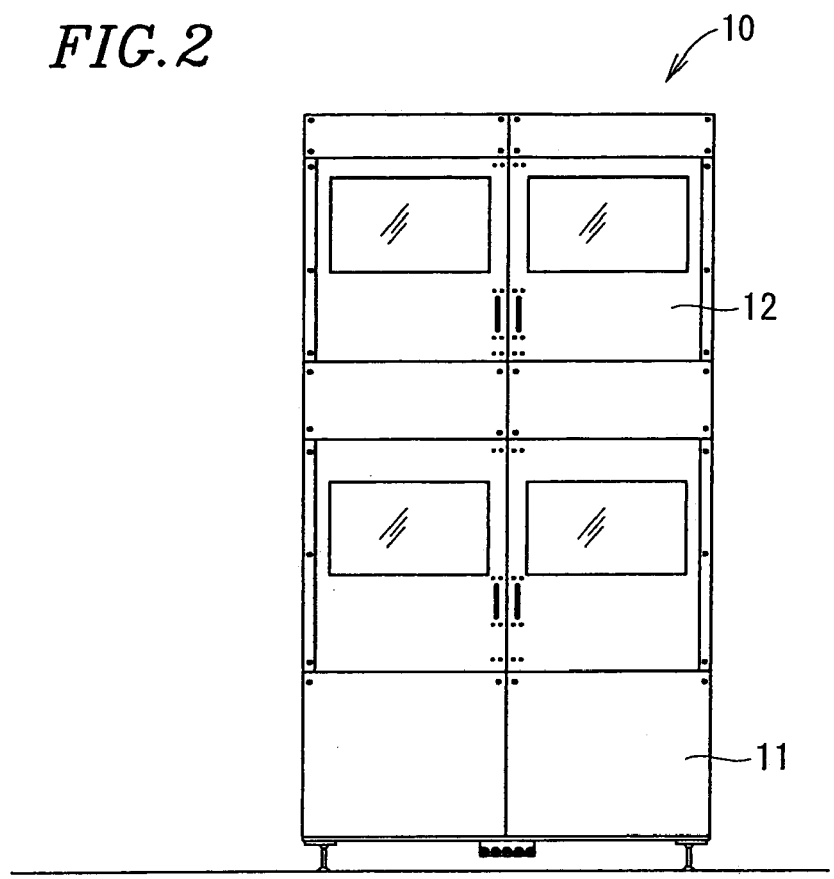
FIG. 2 is a side view of the substrate cleaning device of FIG. 1.
Figure 3:
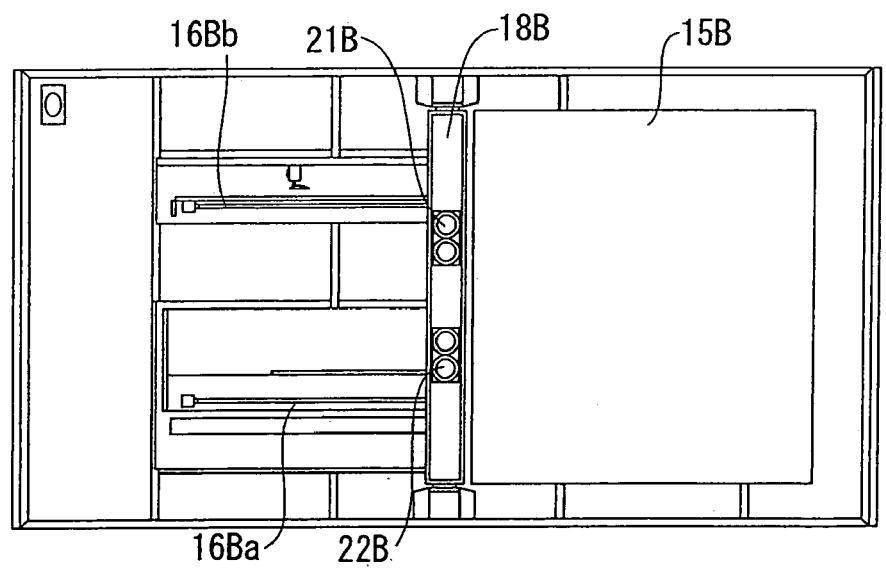
FIG. 3 is a plan view of the substrate cleaning device of FIG. 1.

FIG. 1 is a front view showing an exemplary substrate cleaning device 10 according to an embodiment of the present invention. FIGS. 2 and 3 are side and plan views, respectively, of the substrate cleaning device 10.

The substrate cleaning device 10 is provided in, for example, a clean room of a liquid crystal display panel manufacturing plant and is used to clean glass substrates immediately before a certain process is carried out on the glass substrates.

The substrate cleaning device 10 of the present invention comprises a base portion 11 in the shape of a rectangular prism at a lower portion thereof. A space over the base portion 11 is entirely surrounded by a side wall 12. A top side of the space over the base portion 11 is open so that clean air flows down from a ceiling and enters the space.

Figure 4:
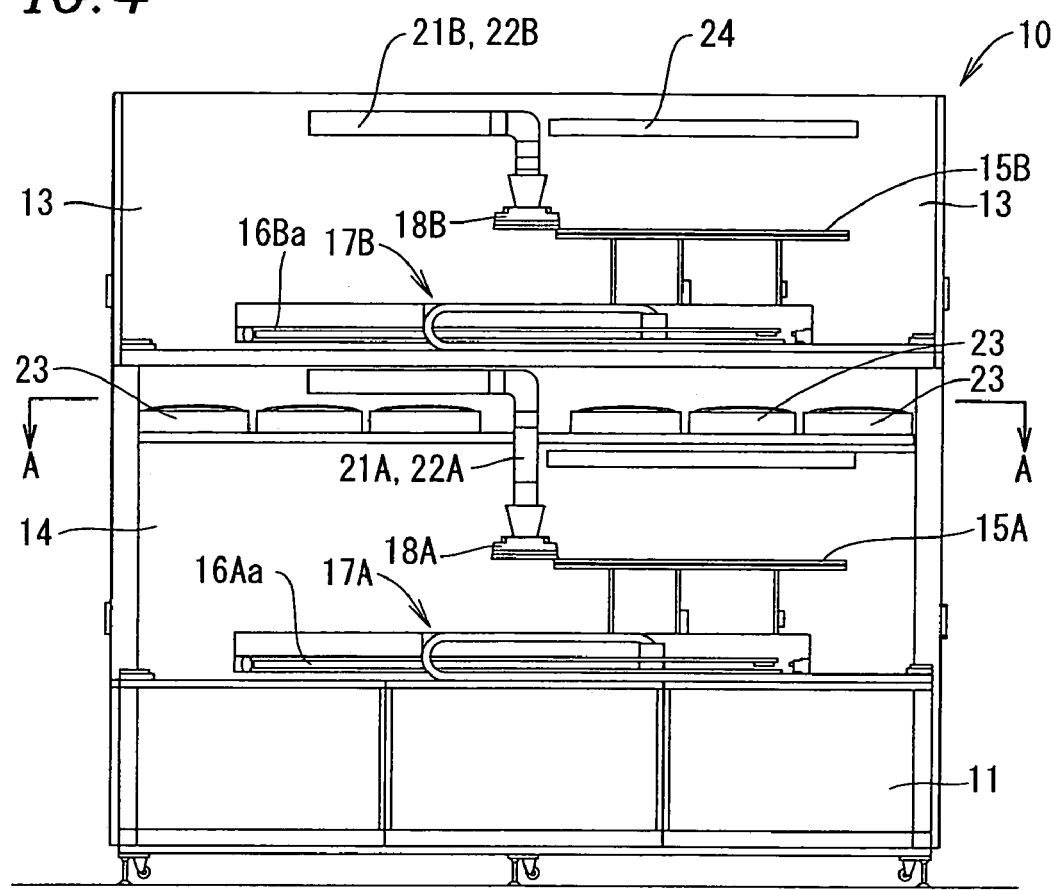
FIG. 4 is a front cross-sectional view showing the inside of the substrate cleaning device of FIG. 1.
Figure 5:
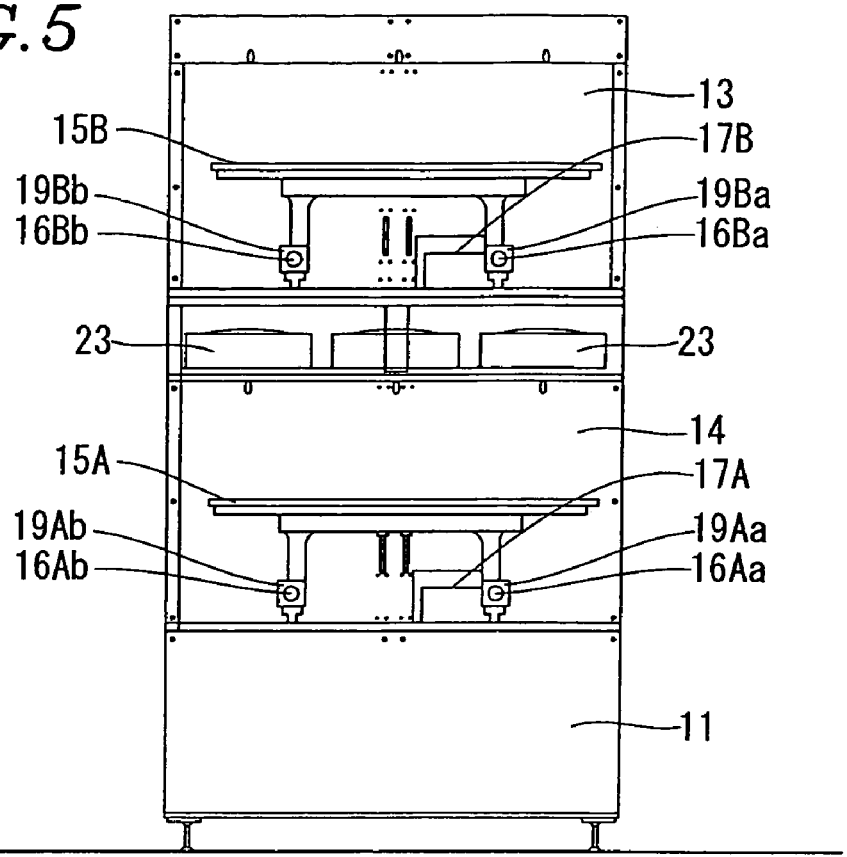
FIG. 5 is a side cross-sectional view showing the inside of the substrate cleaning device of FIG. 1.
Figure 6:
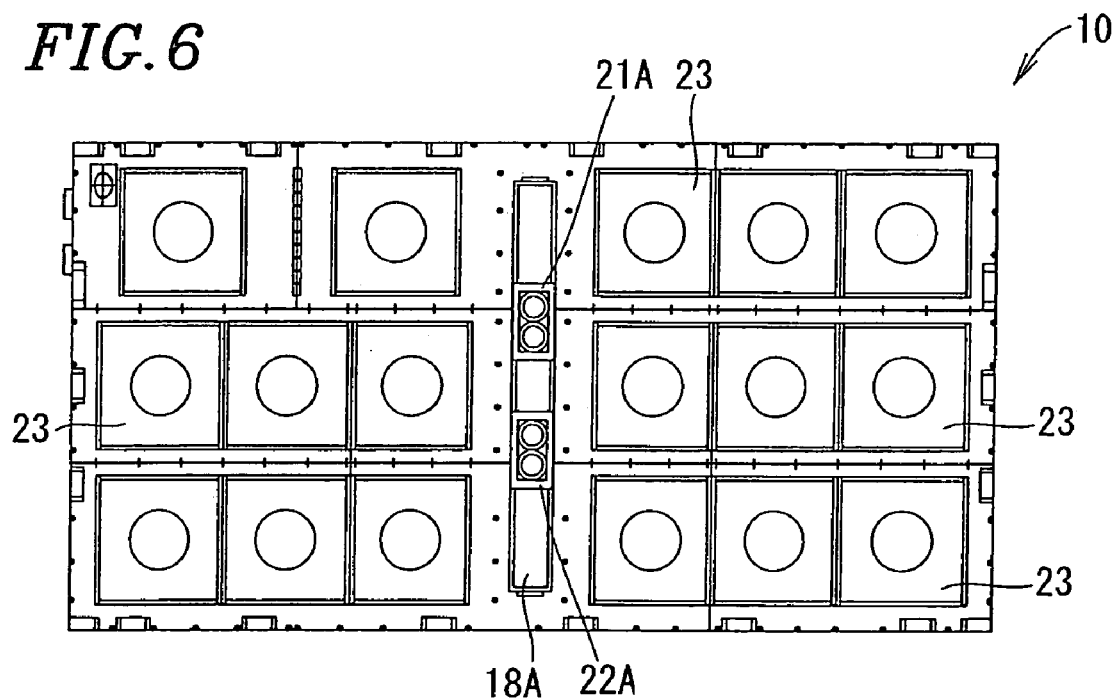
FIG. 6 is a plan cross-sectional view, taken along a line A-A of FIG. 4.

FIGS. 4 and 5 are front and side cross-sectional views, respectively, showing the inside of the substrate cleaning device 10. FIG. 6 is a plan cross-sectional view, taken along a line A-A of FIG. 4.

The top side of the base portion 11 is in the shape of a horizontal rectangle and has an area such that two rectangular glass substrates to be cleaned can be placed side by side. The space over the base portion 11 surrounded by the side wall 12 is in the shape of a hollow rectangular prism. The rectangular prism portion is divided into an upper cleaning room 13 and a lower cleaning room 14. Therefore, the upper cleaning room 13 and the lower cleaning room 14 are vertically stacked, substantially without horizontal dislocation. In actual practice, the upper cleaning room 13 and the lower cleaning room 14 are projected onto a plane perpendicular to the vertical axis thereof, and the vertically stacked upper cleaning room 13 and lower cleaning room 14 are adjusted so as to maximize the overlapping area of their images on the plane.

A plurality of high efficiency particular air filters ("HEPA filter") 23 are horizontally provided in substantially an entire region between the upper cleaning room 13 and the lower cleaning room 14. Each HEPA filter comprises a fan portion.

Each HEPA filter 23 comprises the fan portion at an upper portion thereof and a filter portion at a lower portion thereof. The fan portion suctions gas (e.g., air, etc.) from the upper cleaning room 13, while the filter portion cleans the gas and supplies the gas into the lower cleaning room 14.

A lower opening portion 12a is provided on a part of the side wall 12 at a longitudinal side of the lower cleaning room 14, through which a glass substrate to be cleaned is inserted into the lower cleaning room 14 while keeping the glass substrate in a horizontal position (FIG. 1).

In the lower cleaning room 14, a slide table 15A on which the inserted glass substrate is horizontally placed is provided over the base portion 11. An upper side of the slide table 15A is in the shape of a rectangle having substantially the same area as that of a glass substrate inserted into the lower cleaning room 14.

As shown in FIG. 5, a ball screw 16Aa is provided on the top side of the base portion 11 along a longitudinal direction (lateral direction) of the base portion. A ball nut 19Aa attached to the slide table 15A is coupled with the ball screw 16Aa via a screw connection. A guide rail 16Ab is provided on the top side of the base portion 11 in parallel to the ball screw 16Aa. A slide guide 19Ab attached to the slide table 15A is slidably engaged with the guide rail 16Ab.

A motor 17A is provided on the base portion 11, which causes the slide table 15A to be reciprocally slid along the ball screw 16Aa and the guide rail 16Ab by rotating the ball screw 16Aa forwards and backwards. The slide table 15A is slid by the motor 17A from one side of the base portion 11 to the other side in the longitudinal direction thereof over a distance the longitudinal length or more of the slide table 15A, i.e., 1 pitch or more, and thereafter, returns to a stand-by position.

A nozzle head 18A is provided in the lower cleaning room 14, which functions as a cleaning portion for cleaning a surface (top side) of a glass substrate placed on the slide table 15A. The nozzle head 18A is positioned at a middle of the region in which the slide table 15A can be slid. The nozzle head 18A is elongated in a direction perpendicular to the sliding direction of the slide table 15A. The length of the nozzle head 18A is slightly longer than the length of a glass substrate placed on the slide table 15A in a direction perpendicular to the sliding direction of the slide table 15A. By sliding the slide table 15A, the entire surface of a glass substrate placed on the slide table 15A can face the nozzle head 18A.

The nozzle head 18A has a blowing outlet on a bottom side thereof facing the slide table 15A and along a direction perpendicular to the sliding direction of the slide table 15A. Air is blown onto the surface of the glass substrate through the blowing outlet. The nozzle head 18A has a suctioning inlet provided adjacent and parallel to the blowing outlet. The air blown onto the glass substrate is suctioned through the suctioning inlet. The blowing outlet and the suctioning inlet are provided over substantially the full length of the slide table 15A in a direction perpendicular to the sliding direction.

The gas blown through the nozzle head 18A to the surface of the glass substrate may be inert gas (e.g., nitrogen, etc.), ionized gas, ultrasonically vibrated gas or the like, in addition to air.

An air supply duct 21A for supplying air for cleaning the glass substrate to the blowing outlet is coupled with the nozzle head 18A. An air exhaust duct 22A for removing cleaning air which has been blown onto a glass substrate and has been suctioned through the suctioning inlet, is also coupled with the nozzle head 18A. The air supply duct 21A and the air exhaust duct 22A are arranged side by side and are coupled to a middle portion of the nozzle head 18A in the longitudinal direction thereof. The air supply duct 21A and the air exhaust duct 22A are extended vertically upward from the nozzle head 18A, and are bent in the region between the upper cleaning room 13 and the lower cleaning room 14, extending along the HEPA filters 23 toward the outside of the substrate cleaning device 10.

An upper opening portion 12b through which a substrate is inserted is provided on a portion of the side wall 12 at a side of the upper cleaning room 13 over the HEPA filters 23 (FIG. 1). In the side wall 12, the side of the upper cleaning room 13 on which the upper opening portion 12b is provided is opposite to the side of the lower cleaning room 14 on which the lower opening portion 12a is provided. A glass substrate is horizontally inserted through the upper opening portion 12b into the upper cleaning room 13.

A slide table 15B on which a glass substrate is horizontally placed is provided in the upper cleaning room 13, as in the lower cleaning room 14. A ball nut 19Ba coupled with a ball screw 16Ba via a screw connection and a slide guide 19Bb slidably engaged with a guide rail 16Bb, which are provided over the HEPA filters 23, are attached to the slide table 15B. The ball screw 16Ba is rotated forwards and backwards by a motor 17B. As is the slide table 15B in the lower cleaning room 14, the slide table 15B is reciprocally moved along the ball screw 16Ba and the guide rail 16Bb by means of the motor 17B.

As is the slide table 15A in the lower cleaning room 14, the slide table 15B is slid by the motor 17B from one side of the upper cleaning room 13 to the other side in the longitudinal direction thereof over a distance the longitudinal length or more of the slide table 15B, i.e., 1 pitch or more, and thereafter, returns to a stand-by position.

As is the lower cleaning room 14, the upper cleaning room 13 is provided with a nozzle head 18B which functions as a cleaning portion for cleaning a surface (topside) of a glass substrate placed on the slide table 15B. The nozzle head 18B has substantially the same structure as that of the nozzle head 18A in the lower cleaning room 14. A blowing outlet and a suctioning inlet are provided on a bottom side of the nozzle head 18B. An air supply duct 21B and an air exhaust duct 22B are coupled with the blowing outlet and the suctioning inlet, respectively.

The top side of the upper cleaning room 13 is open. A plurality of dust collecting devices 24 for ionizing supplied air is horizontally provided, covering a portion of the top side of the upper cleaning room 13. The dust collecting device 24 collects dust from clean air supplied into the clean room by ionizing the air.

The substrate cleaning device 10 having the above-described configuration is provided in a substrate processing facility installed in a liquid crystal display panel manufacturing plant.

Figure 7:
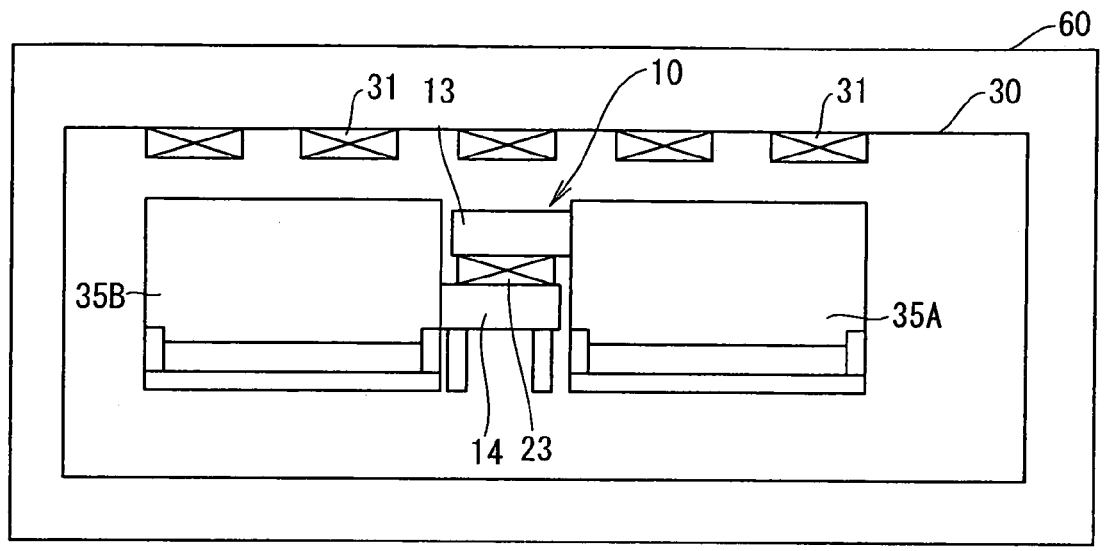
FIG. 7 is a front view showing an exemplary layout of a substrate processing facility of the present invention.
Figure 8:
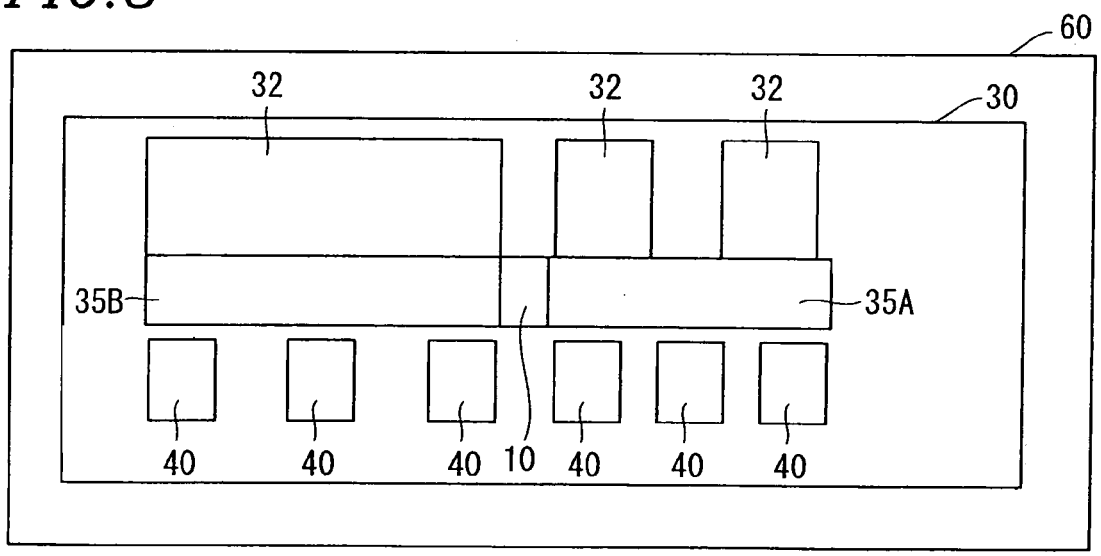
FIG. 8 is a plan view showing an exemplary layout of the substrate processing facility of FIG. 7.
Figure 9:
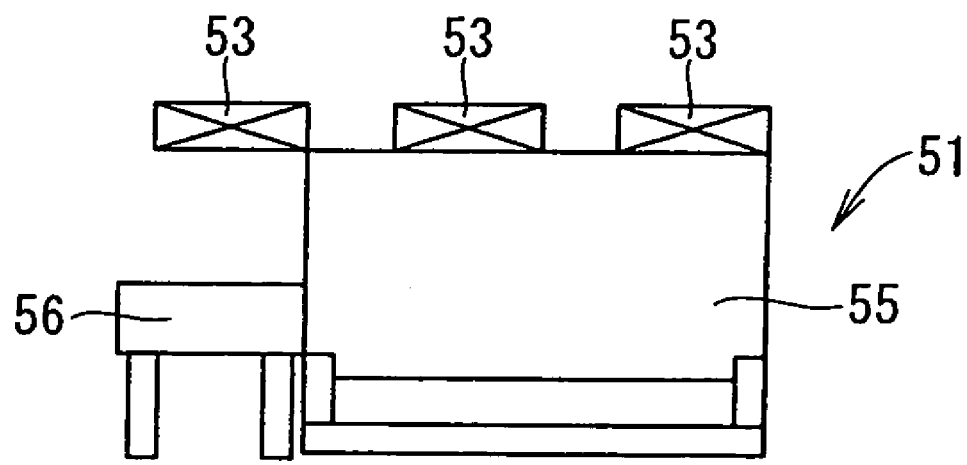
FIG. 9 is a front view showing an exemplary layout of a conventional substrate processing facility.
Figure 10:
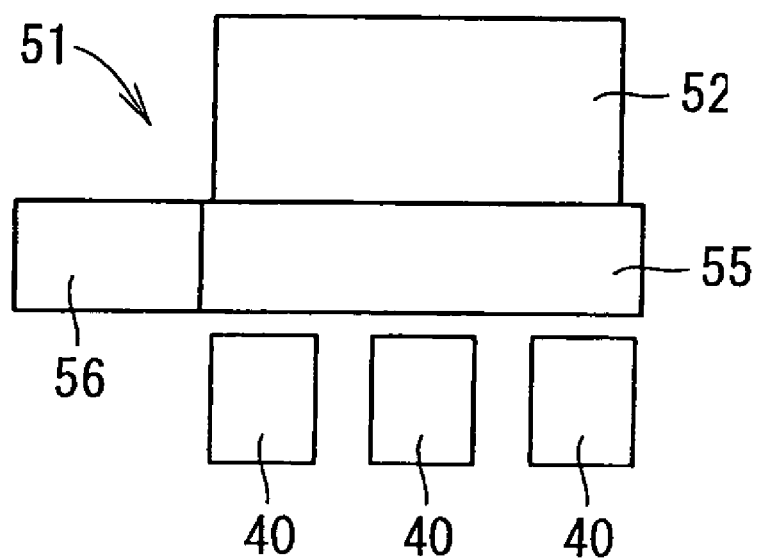
FIG. 10 is a plan view of the conventional substrate processing facility of FIG. 9.

FIG. 7 is a front view showing an exemplary layout of a substrate processing facility 60 of the present invention. FIG. 8 is a plan view showing an exemplary layout of the substrate processing facility 60 of the present invention.

The substrate processing facility 60 has a clean room 30 in which a plurality of process apparatuses 32 for processing glass substrates in a predetermined manner are provided. The substrate cleaning device 10 of the present invention is provided in the clean room 30. In FIG. 7, the substrate cleaning device 10 is schematically shown, having the upper cleaning room 13, the lower cleaning room 14, and the HEPA filters 23.

A plurality of HEPA filters 31 are provided horizontally side by side at an upper portion of the clean room 30. Air cleaned by the HEPA filters 31 flows down into the clean room 30.

In the clean room 30, a pair of loading apparatuses 35A and 35B for transporting a glass substrate to a predetermined process apparatus 32 are provided. The loading apparatus 35A and the loading apparatus 35B are placed substantially on a line with the substrate cleaning device 10 being sandwiched therebetween. The loading apparatuses 35A and 35B each transport a glass substrate. A plurality of glass substrates housed in the respective cassettes 40 are brought into the clean room 30. The glass substrates are used for liquid crystal display panels. A plurality of cassettes 40 are placed at a side of each of the loading apparatuses 35A and 35B in a transporting direction of the loading apparatuses 35A and 35B.

In each cassette 40, a plurality of glass substrates oriented horizontally are stacked vertically, spaced at appropriate intervals. The loading apparatuses 35A and 35B are each provided with a glass substrate suctioning hand having a pair of planar suctioning pads in parallel, which pick out a glass substrate from one of the cassettes 40 placed in along the side of the loading apparatuses 35A and 35B. The glass substrate suctioning hand can be moved vertically and longitudinally with respect to the loading apparatuses 35A and 35B.

The glass substrate suctioning hand of each of the loading apparatuses 35A and 35B transports a glass substrate picked out from the cassette 40 to the substrate cleaning device 10, and places the glass substrate onto the slide table 15A or 15B provided in the upper cleaning room 13 or lower cleaning room 14 of the substrate cleaning device 10. The glass substrate is cleaned by the substrate cleaning device 10, and thereafter, is removed from the upper cleaning room 13 or lower cleaning room 14 by the glass substrate suctioning hand of the loading apparatus 35A or 35B.

A plurality of process apparatuses 32 for carrying out a predetermined process on a glass substrate are provided at a side of the loading apparatuses 35A and 35B opposite to the side thereof on which the cassettes 40 are provided. A glass substrate which has been picked out through the upper cleaning room 13 or lower cleaning room 14 of the substrate cleaning device 10 by the glass substrate suctioning hand of the loading apparatus 35A or 35B, is placed at a predetermined position in the process apparatus 32 provided at the side of the loading apparatus 35A or 35B.

The process apparatus 32 may be any apparatus which carries out a predetermined process on a glass substrate supplied by the loading apparatus 35A or 35B provided at the side of the loading apparatus 35A or 35B. The predetermined process is not particularly limited. It is not necessary that process apparatuses provided at the side of loading apparatuses 35A and 35B have the same function. A plurality of process apparatuses 32 for carrying out the same or different processes maybe provided at the side of the loading apparatuses 35A and 35B.

In the clean room 30 having the above-described configuration, a glass substrate which has been removed from the cassette 40 by the glass substrate suctioning hand of one loading apparatus (e.g., the loading apparatus 35B), is transferred through the upper opening portion 12b on the side of the upper cleaning room 13 of the substrate cleaning device 10 into the upper cleaning room 13, and is placed on the slide table 15B in the upper cleaning room 13.

On the other hand, a glass substrate which has been removed from the cassette 40 by the glass substrate suctioning hand of the other loading apparatus (e.g., the loading apparatus 35A), is transferred through the lower opening portion 12a on the side of the lower cleaning room 14 of the substrate cleaning device 10 into the lower cleaning room 14, and is placed on the slide table 15A in the lower cleaning room 14.

When a glass substrate is placed on the slide table 15B in the upper cleaning room 13, the slide table 15B is slid from the stand-by position in a horizontal direction. Thereby, the glass substrate placed on the slide table 15B is passed through a region below the nozzle head 18B in the upper cleaning room 13.

The nozzle head 18B blows out air, which is supplied from the air supply duct 21B, through the blowing outlet provided on the bottom side thereof. The air is blown onto a glass substrate passing below the nozzle head 18B. Meanwhile, the air which has been blown onto the glass substrate is suctioned through the suctioning inlet of the nozzle head 18B and is exhausted to the outside of the upper cleaning room 13 by the air exhaust duct 22B.

The nozzle head 18B faces the entire upper surface of a glass substrate which is slid therebelow, with the facing direction perpendicular to the sliding direction. By sliding a glass substrate over 1 pitch or more in a horizontal direction, the entire upper surface of the glass substrate is cleaned. After the entire glass substrate has been passed below the nozzle head 18B, the slide table 15B is slid in the opposite direction so as to clean the glass substrate again.

The slide table 15A provided in the lower cleaning room 14 has substantially the same function as that of the slide table 15B provided in the upper cleaning room 13.

When a glass substrate is placed on the slide table 15A in the lower cleaning room 14, the slide table 15A is slid from the stand-by position in a horizontal direction. Thereby, the glass substrate placed on the slide table 15A is passed through a region below the nozzle head 18A in the lower cleaning room 14.

The nozzle head 18A blows out air, which is supplied from the air supply duct 21A, through the blowing outlet provided on the bottom side thereof. The air is blown onto a glass substrate passing below the nozzle head 18A. Meanwhile, the air which has been blown onto the glass substrate is suctioned through the suctioning inlet of the nozzle head 18A and is exhausted to the outside of the lower cleaning room 14 by the air exhaust duct 22A.

The nozzle head 18A faces the entire upper surface of a glass substrate which is slid therebelow, with the facing direction perpendicular to the sliding direction. By sliding a glass substrate over 1 pitch or more in a horizontal direction, the entire upper surface of the glass substrate is cleaned. After the entire glass substrate has been passed below the nozzle head 18A, the slide table 15A is slid in the opposite direction so as to clean the glass substrate again.

In the substrate processing facility 60, air cleaned by the HEPA filter 31 provided at the top portion of the clean room 30 flows into the upper cleaning room 13 directly or via the dust collecting device 24. Therefore, there is substantially no risk of contaminating a glass substrate on the slide table 15B in the upper cleaning room 13 with air flowing into the upper cleaning room 13. Thus, a glass substrate is reliably cleaned.

Dust is collected from air flowing into the upper cleaning room 14 by the HEPA filter 23 provided between the upper cleaning room 13 and the lower cleaning room 14 before flowing into the lower cleaning room 14. Therefore, there is substantially no risk that dust generated by the slide table 15B, the ball screw 16Ba, and the like in the upper cleaning room 13 flows into the lower cleaning room 14. Therefore, a glass substrate on the slide table 15A is cleaned in clean air in the lower cleaning room 14. Thus, glass substrates can be reliably cleaned in the lower cleaning room 14.

Thus, when the slide table 15A is reciprocally moved and is returned to the stand-by position, a glass substrate placed on the slide table 15A is removed from the lower cleaning room 14 through the lower opening portion 12a on the side of the lower cleaning room 14 by the glass substrate suctioning hand of the loading apparatus 35A. Thereafter, the glass substrate is transported into a predetermined process apparatus 32 at the side of the loading apparatus 35A by being placed at a predetermined position corresponding to the process apparatus 32.

Similarly, when the slide table 15B is reciprocally moved and is returned to the stand-by position, a glass substrate placed on the slide table 15B is removed from the upper cleaning room 13 through the upper opening portion 12b on the side of, the upper cleaning room 13 by the glass substrate suctioning hand of the loading apparatus 35B. Thereafter, the glass substrate is transported into a predetermined process apparatus 32 at the side of the loading apparatus 35B and is placed at a predetermined position of the process apparatus 32.

As described above, the upper cleaning room 13 and the lower cleaning room 14 are stacked vertically in the substrate cleaning device 10, so that the area occupied by the substrate cleaning device 10 can be reduced. Particularly, even if the area of a glass substrate to be cleaned is increased, an increase in the area occupied by the substrate cleaning device 10 is suppressed. Therefore, the footprint of the manufacturing plant for display panels, such as liquid crystal display panels or the like, can be reduced.

Further, glass substrates can be simultaneously cleaned in the upper cleaning room 13 and the lower cleaning room 14 arranged vertically, thereby significantly improving the efficiency of cleaning glass substrates.

The above-described substrate cleaning device 10 comprises two cleaning rooms arranged vertically (the upper cleaning room 13 and the lower cleaning room 14). However, the present invention is not limited to such a configuration. The above-described substrate cleaning device 10 may comprise three or more cleaning rooms, at least two of which are stacked vertically, for example. In this case, the footprint of the substrate cleaning device can be reduced.

In the above-described substrate cleaning device 10, the upper cleaning room 13 and the lower cleaning room 14 are arranged vertically without dislocation in a horizontal direction. The present invention is not limited to such a configuration. Alternatively, the upper cleaning room 13 and the lower cleaning room 14 may be shifted from each other in a horizontal direction so that the upper cleaning room 13 and the lower cleaning room 14 partially overlap each other. When the substrate cleaning device 10 comprises three or more cleaning rooms, at least two of the cleaning rooms arranged vertically may be shifted from one another, partially overlapping one another.

By arranging two or more cleaning rooms vertically while overlapping one another, the footprint of the substrate cleaning device can be reduced.

When two cleaning rooms arranged vertically are shifted from each other in a horizontal direction, a filter (e.g., the HEPA filter 23 or the like) may be provided only on a region in which the two cleaning rooms overlap. In this case, a lower cleaning room which is shifted from an upper cleaning room in a horizontal direction and partially overlaps the upper cleaning room, is open to space above, except the overlapping region in which the HEPA filter 23 is provided. Clean air flows directly into the lower cleaning room via the open portion without the filter or the like.

According to the present invention, a substrate cleaning device is provided which comprises at least two cleaning rooms containing a cleaning portion for cleaning a surface of a substrate. The cleaning rooms are stacked vertically while at least partially overlapping one another. Therefore, the footprint of the substrate cleaning device can be reduced. Moreover, substrates can be efficiently cleaned. A filter is provided in the overlapping region of the two cleaning rooms stacked vertically, thereby substantially eliminating the risk that dust or the like generated in the upper cleaning room flows into the lower cleaning room.

According to the present invention, a substrate processing facility is provided which has a small footprint and can process substrates efficiently.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A substrate cleaning device according comprising:
a first cleaning room including a first cleaning portion for cleaning a substrate placed therein; and
a second cleaning room including a second cleaning portion for cleaning a substrate provided therein,
wherein the first cleaning room is stacked on the second cleaning room so that at least a portion of the first cleaning room overlaps at least a portion of the second cleaning room, wherein
a first table is provided in the first cleaning room, and the first table is slid along a first ball screw by rotating the first ball screw, with the substrate placed in the first cleaning room being placed on the first table; and
a second table is provided in the second cleaning room, and the second table is slid along a second ball screw by rotating the second ball screw, with the substrate placed in the second cleaning room being placed on the second table.

2. A substrate cleaning device comprising:
a first cleaning room including a first cleaning portion for cleaning a substrate placed therein; and
a second cleaning room including a second cleaning portion for cleaning a substrate provided therein,
wherein the first cleaning room is stacked on the second cleaning room so that at least a portion of the first cleaning room overlaps at least a portion of the second cleaning room,
a first opening portion is provided on a side wall of the first cleaning room,
a second opening portion is provided on a side wall of the second cleaning room, and
the side wall of the first cleaning room provided with the first opening portion is opposite to the side wall of the second cleaning room provided with the second opening portion.

3. A substrate cleaning comprising:
a first cleaning room including a first cleaning portion for cleaning a substrate placed therein; and
a second cleaning room including a second cleaning portion for cleaning a substrate provided therein,
wherein the first cleaning room is stacked on the second cleaning room so that at least a portion of the first cleaning room overlaps at least a portion of the second cleaning room, wherein
the first cleaning portion comprises a first nozzle head having a first blowing portion for blowing gas onto the substrate placed in the first cleaning room and a first suctioning portion for suctioning the gas in the first cleaning room; and
the second cleaning portion comprises a second nozzle head having a second blowing portion for blowing gas onto the substrate placed in the second cleaning room and a second suctioning portion for suctioning the gas in the second cleaning room.

4. A substrate processing facility comprising a clean room, wherein:
- a substrate cleaning device is provided in the clean room; and the substrate cleaning device comprises:
  - a first cleaning room including a first cleaning portion for cleaning a substrate placed therein; and
  - a second cleaning room including a second cleaning portion for cleaning a substrate provided therein,
  - wherein the first cleaning room is stacked on the second cleaning room so that at least a portion of the first cleaning room overlaps at least a portion of the second cleaning room,
  - a first table is provided in the first cleaning room, and the first table is slid along a first ball screw by rotating the first ball screw, with the substrate placed in the first cleaning room being placed on the first table; and
  - a second table is provided in the second cleaning room, and the second table is slid along a second ball screw by rotating the second ball screw, with the substrate placed in the second cleaning room being placed on the second table.

5. A substrate processing facility according to claim 4, wherein a first loading apparatus for placing the substrate on the first table in the first cleaning room and a second loading apparatus for placing the substrate on the second table in the second cleaning room are provided in the clean room.

6. A substrate processing facility according to claim 4, wherein the first loading apparatus and the second loading apparatus are arranged substantially on a line with the substrate cleaning device being sandwiched between the first loading apparatus and the second loading apparatus in the clean room.

* * * * *